US011625079B2

(12) United States Patent
Chen et al.

(10) Patent No.: US 11,625,079 B2
(45) Date of Patent: Apr. 11, 2023

(54) STAGGERED ARRANGEMENT GRAPHITE HEAT SINK FOR LIQUID COOLING COLD PLATE

(71) Applicant: Quanta Computer Inc., Taoyuan (TW)

(72) Inventors: Chao-Jung Chen, Taoyuan (TW);
Yu-Nien Huang, Taoyuan (TW);
Kuo-Wei Lee, Taoyuan (TW)

(73) Assignee: QUANTA COMPUTER INC.,
Taoyuan (TW)

( * ) Notice: Subject to any disclaimer, the term of this patent is extended or adjusted under 35 U.S.C. 154(b) by 9 days.

(21) Appl. No.: 17/237,018

(22) Filed: Apr. 21, 2021

(65) Prior Publication Data

US 2022/0197353 A1 Jun. 23, 2022

Related U.S. Application Data

(60) Provisional application No. 63/130,188, filed on Dec. 23, 2020.

(51) Int. Cl.
*G06F 1/20* (2006.01)
*H05K 7/20* (2006.01)

(52) U.S. Cl.
CPC .......... *G06F 1/20* (2013.01); *H05K 7/20254* (2013.01); *H05K 7/20272* (2013.01); *H05K 7/20409* (2013.01); *H05K 7/20509* (2013.01); *G06F 2200/201* (2013.01)

(58) Field of Classification Search
CPC ................ G06F 1/20; G06F 2200/201; H05K 7/20254; H05K 7/20272; H05K 7/20409; H05K 7/20509
See application file for complete search history.

(56) References Cited

U.S. PATENT DOCUMENTS

| 7,836,597 | B2* | 11/2010 | Datta ................. H01L 21/4882 29/890.032 |
| 9,392,731 | B2* | 7/2016 | Mann ................. H01L 23/4093 |
| 10,293,372 | B2* | 5/2019 | Buvid ............... H05K 7/20254 |
| 10,834,847 | B1* | 11/2020 | Yatskov ............ H05K 7/20254 |
| 10,842,043 | B1* | 11/2020 | Zhang ............... H05K 7/20254 |
| 2008/0084664 | A1* | 4/2008 | Campbell ................ G06F 1/20 361/699 |
| 2012/0075807 | A1* | 3/2012 | Refai-Ahmed ... H01L 23/49827 257/E23.101 |
| 2017/0045300 | A1* | 2/2017 | Boday ............... H05K 7/20254 |
| 2020/0161215 | A1* | 5/2020 | McNamara .......... H01L 23/367 |
| 2021/0315132 | A1* | 10/2021 | Duong ................. H05K 7/2049 |

* cited by examiner

*Primary Examiner* — Stephen S Sul
(74) *Attorney, Agent, or Firm* — Nixon Peabody LLP

(57) ABSTRACT

A cooling device for a computing system is disclosed. The device includes a heat sink, a base, and a cover. The heat sink includes a plurality of fins extending from a first section of the heat sink. The base includes a plurality of grooves on a first side. The plurality of grooves is configured to mate with at least a portion of the plurality of fins of the heat sink. The cover is configured to be coupled to the base and encapsulate the heat sink. The cover further includes two apertures, each aperture configured to be connected to a tube. A width of the plurality of fins of the heat sink is less than a width of the plurality of grooves of the base. A height of the heat sink is less than a height of an interior portion of the cover.

20 Claims, 6 Drawing Sheets

STAGGERED ARRANGEMENT GRAPHITE HEAT SINK FOR LIQUID COOLING COLD PLATE

CROSS-REFERENCE TO RELATED APPLICATIONS

This application claims benefit of and priority under 35 U.S.C. § 119 to U.S. Provisional Application No. 63/130,188, entitled "Staggered Arrangement Graphite Heat Sink For Liquid Cooling Cold Plate," and filed on Dec. 23, 2020. The contents of that application are hereby incorporated by reference in their entirety.

TECHNICAL FIELD

The present disclosure relates generally to a method for cooling components of a computing system, and more specifically, to a liquid cooling method that utilizes a heat sink for cooling components of a server system.

BACKGROUND

Computer enclosures and other types of electronic equipment often contain many electronic components that generate heat. Typically, the heat in the system is confined to the enclosure. Thus, additional methods are implemented to reduce the temperature of the specific components or the system overall. The heat generated by each component also increases based on increases in processing power. Therefore, overheating is a common issue, which can have a negative impact on the performance of the components in the system. Overheating reduces efficiency and may cause long term damage to the components.

A common way to reduce the temperature in a computing system is to include one or more fans in the system to increase air flow. Increasing air flow in the system usually decreases the temperature of the system in the aggregate. However, it may be difficult to target a specific electronic component that may produce more heat than others and, therefore, need more cooling measures. Thus, liquid cooling systems are often used for direct, localized cooling because such systems offer higher heat transfer rates than fans. Liquid cooling systems can be used as an alternative, or in conjunction, with fans.

Liquid cooling systems generally include a cooling assembly that has a heat sink, a cold plate fabricated from a metal, and connections for tubes directing cooling liquid into and out of the cooling assembly. The cooling assembly is typically placed above components, such as processor units, which produce relatively high amounts of heat compared to other components of the system. Thus, it is very important for the liquid not to leak from the cooling assembly because leaking coolant may cause damage to the rest of the system, especially the electrical components.

Additionally, the heat sink in the cooling assembly is typically placed in an orientation where protruding fins of the heat sink extend from a bottom portion of the heat sink. The fins of the heat sink serve the purpose of providing additional surface area, thus increasing contact with air or liquid coolant. Therefore, the fins of the heat sink increase the rate of heat dissipation. However, this orientation of the fins may not provide the most surface area closest to the heat source. Moreover, many heat sinks are fabricated from copper or aluminum, which may not possess optimal thermal conductivity. Greater thermal conductivity may increase the rate of heat dissipation, thus, decreasing the time to cool a system component.

Thus, there exists a need for a cooling system with a high rate of heat dissipation. More specifically, there is a need to design a heat sink that has more surface area closer to the heat source. Additionally, there is a need to design a heat sink with a high thermal conductivity. There is also a need for reducing the time for cooling a component in a computing system using a cooling assembly.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a cooling device for a computing system is disclosed. The device includes a heat sink, a base, and a cover. The heat sink includes a plurality of fins extending from a first section of the heat sink. The base includes a plurality of grooves on a first side. The plurality of grooves is configured to mate with at least a portion of the plurality of fins of the heat sink. The cover is configured to be coupled to the base and encapsulate the heat sink.

According to a configuration of the above implementation, the cover further includes two apertures, each aperture configured to be connected to a tube.

In a further aspect of the above implementation, a width of the plurality of fins of the heat sink is less than a width of the plurality of grooves of the base.

In another aspect of the above implementation, a height of the heat sink is less than a height of the interior portion of the cover.

According to another configuration of the above implementation, a length of the heat sink is less than a length of the base.

In a further aspect of the above implementation, the plurality of fins is rectangularly shaped.

In yet a further aspect of the above implementation, the heat sink is formed from graphite and the cover and the base member are metal.

Another aspect of the present disclosure includes a cooling assembly for a computing system. The cooling assembly includes an inlet tube, and outlet tube, and a device. The inlet tube is configured to transport liquid into the assembly. The outlet tube configured to transport liquid out of the assembly. The device includes a heat sink, a base, and a cover. The heat sink has a plurality of fins extending from a first section of the heat sink. The base includes a plurality of grooves on a first side. The plurality of grooves is configured to mate with at least a portion of the plurality of fins of the heat sink. The cover is configured to be coupled to the base to encapsulate the heat sink. The cover includes a connector to the inlet tube to accept the inflow of liquid coolant and a connector to the outlet tube to carry away liquid coolant According to a configuration of the above implementation, the cover further includes two apertures, each aperture configured to be connected to either the outlet tube or the inlet tube.

In a further aspect of the above implementation, a width of the plurality of fins of the heat sink is less than a width of the plurality of grooves of the base.

In another aspect of the above implementation, a height of the heat sink is less than a height of the interior portion of the cover.

According to another configuration of the above implementation, a length of the heat sink is less than a length of the base.

In a further aspect of the above implementation, the plurality of fins is rectangularly shaped.

In yet a further aspect of the above implementation, the heat sink is formed from graphite and the cover and the base member are metal.

Another aspect of the present disclosure includes a system. The system includes an inlet tube, an outlet tube, an electronic component, and a device. The inlet tube is couplable to a liquid coolant circulation system. The inlet tube transports liquid coolant from the circulation system. The outlet tube is couplable to the liquid coolant circulation system to transport liquid coolant to the liquid coolant circulation system. The electronic component generates heat. The device is thermally connected to the electronic component. The device includes a heat sink, a base, and a cover. The heat sink includes a plurality of fins extending from a first section of the heat sink. The base includes a plurality of grooves on a first side. The plurality of grooves is configured to mate with at least a portion of the plurality of fins of the heat sink. The cover is configured to be coupled to the base and encapsulate the heat sink. The cover is configured to be coupled to the inlet tube and the outlet tube.

According to a configuration of the above implementation, the cover further includes two apertures, each aperture configured to be connected to either the outlet tube or the inlet tube.

In a further aspect of the above implementation, a width of the plurality of fins of the heat sink is less than a width of the plurality of grooves of the base.

In another aspect of the above implementation, a height of the heat sink is less than a height of the interior portion of the cover.

According to another configuration of the above implementation, a length of the heat sink is less than a length of the base.

In a further aspect of the above implementation, the plurality of fins is rectangularly shaped.

In yet a further aspect of the above implementation, the heat sink is formed from graphite and the cover and the base member are metal.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
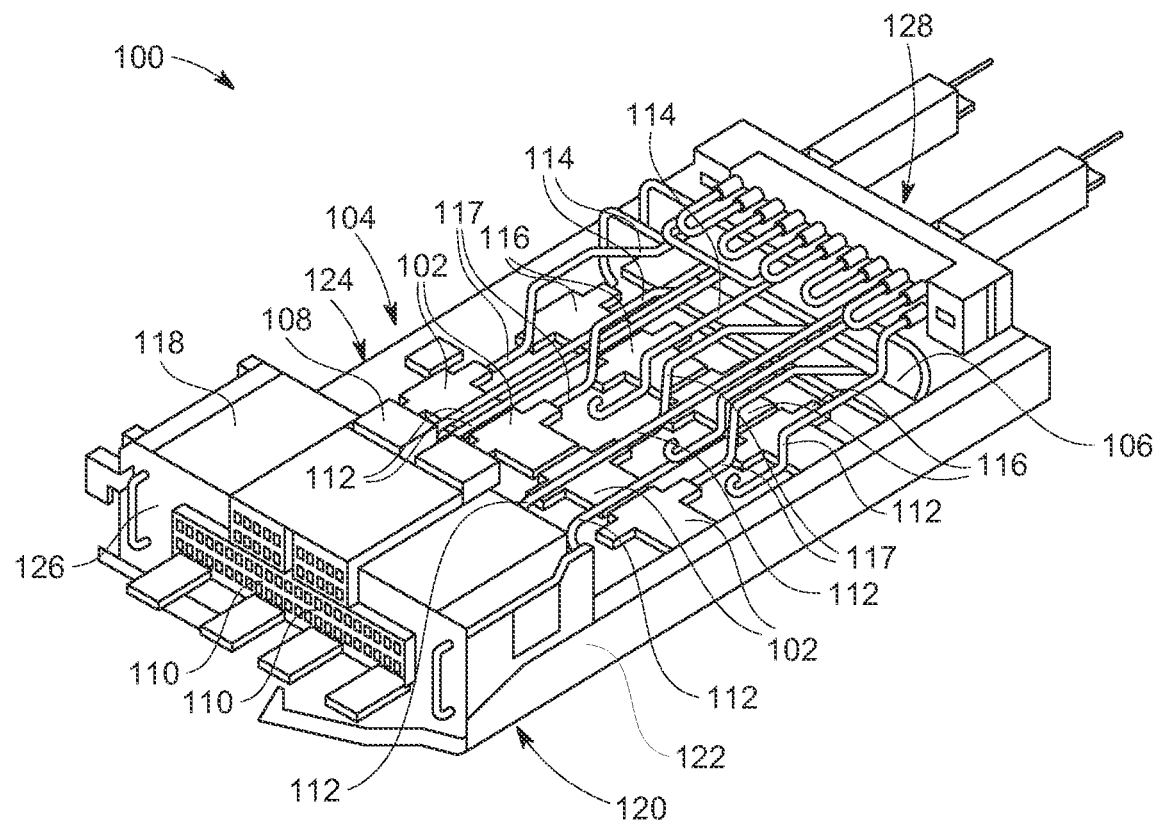
FIG. 1 is a perspective view of a computing system with an example cooling system in a chassis of the computing system.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed to a method for cooling computing system components, and more specifically, to a liquid cooling method that utilizes a heat sink for cooling components of a server system.

FIG. 1 is a perspective view of a computing system such as, but not limited to, a server system 100. The server system 100 includes a plurality of cooling assemblies 102 in a chassis 104. The illustrated server system 100 includes the chassis 104, a motherboard 106, a power supply 108, a series of connection ports 110, a series of cooling liquid inlet tubes 112, a series of cooling liquid outlet tubes 114, and electronic components 116. In other implementations, the server system 100 may include more than the listed components or less than the listed components. The chassis 104 includes a top panel 118, a bottom panel 120, a first side wall 122, a second side wall 124, a front wall 126, and a back wall 128 to enclose the electronic components of the server system 100. The top panel 118 and the bottom panel 120 are generally perpendicular to the first side wall 122 and the second side wall 124.

In some implementations, the electronic components 116 are chips, such as processing and memory units, including high-density power chips. The electronic components 116 include a set of cooled electronic components 117, where the cooled electronic components 117 have been cooled by the cooling assembly 102. A set of electronic components 116 is generally located around the chassis 104, and placed on the bottom panel 120, between the first side wall 122 and the second side wall 124. Another set of electronic components 116 is generally located between the front wall 126 and the back wall 128. In this example, there are multiple cooling assemblies 102 located above the electronic components 116. More specifically, the set of cooled electronic components 117 are located below the cooling assemblies 102. The cooling assemblies 102 may be located in the chassis 104, in between the electronic components 116, or above the electronic components 116 to transfer heat away from the electronic components 116. The set of inlet tubes 112 may be connected to a portion of the cooling assemblies 102. The set of outlet tubes 114 may also be connected to a portion of the cooling assemblies 102. The power supply 108 may be located near the front wall 126. The series of connection ports 110 may also be located on the front wall 126. The motherboard 106 may be located on a portion of the chassis 104 nearest to the bottom panel 120 and the back wall 128.

The individual components of server system 100, such as the processor units, may dissipate, generate, produce, or radiate heat. Thus, the heat in the server system 100 may accumulate if a cooling mechanism is not implemented. The inlet tubes 112, the outlet tubes 114, and the cooling assemblies 102 may function as a cooling system to circulate a liquid coolant to decrease the overall temperature in the chassis 104. More specifically, each of the cooling assemblies 102 of the server system 100 may cool a component to a lower temperature by transferring heat to the liquid coolant supplied by the inlet tube 112. As result, heat may be reduced based on the relatively lower temperature of the cooling assembly 102 absorbing the surrounding heat of the components near the cooling assembly 102, such as the cooled electronic components 117 directly under the cooling assembly 102. The outlet tube 114 then removes the heated liquid coolant from the absorbed heat out of the cooling assembly 102. The heated liquid coolant is circulated to an external heat exchanger (not shown) that removes the heat and recirculates the cooled liquid coolant through the inlet tube 112. The process continues while the inlet tube 112 and outlet tube 114 are in use, circulating the liquid coolant to cool the system.

Figure 2:
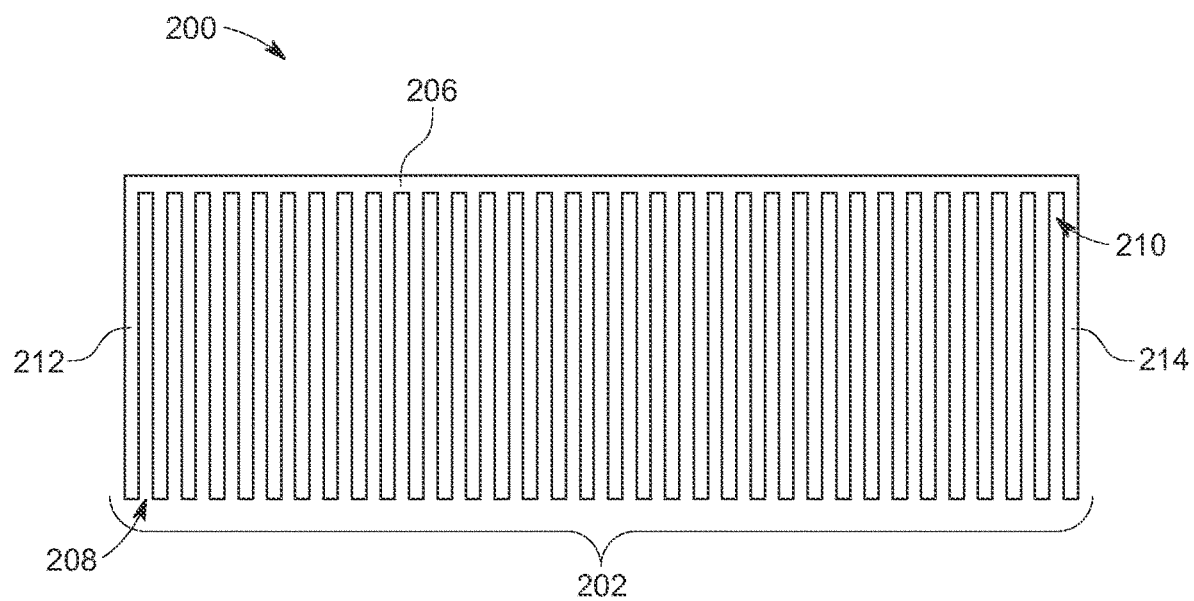
FIG. 2 is a cross-sectional view of an example heat sink that allows for cooling liquid to flow through it.

FIG. 2 is a cross-sectional view of a heat sink 200 that allows for a liquid coolant to flow through it. The heat sink 200 may be a component in the cooling assembly 102 shown in FIG. 1. The heat sink 200 includes a top section 206, and a bottom section 208. As illustrated, the heat sink 200 has a generally rectangular cross-section and resembles a rectangular prism. A plurality of fins 202 extends from the top section 206 of the heat sink 200. The plurality of fins 202 may extend the entire length of the top section 206 of the heat sink 200. The heat sink 200 also has a left end 212 and a right end 214. Each of the plurality of fins 202 may be generally rectangular in shape and may extend from the top section 206 to the bottom section 208 at approximately the same distance. Thus, each of the plurality of fins 202 may generally have the same length. The plurality of fins 202 may have a shape different from a rectangle, such as triangle. A gap 210 is formed between each of the plurality of fins 202. Each gap 210 may be approximately the same size and shape or may vary in size and shape and extend to the bottom section 208. In this implementation, the heat sink 200 is fabricated from graphite. In other implementations, the heat sink 200 may be fabricated from other heat absorbent metals; such as copper or aluminum.

Figure 3:
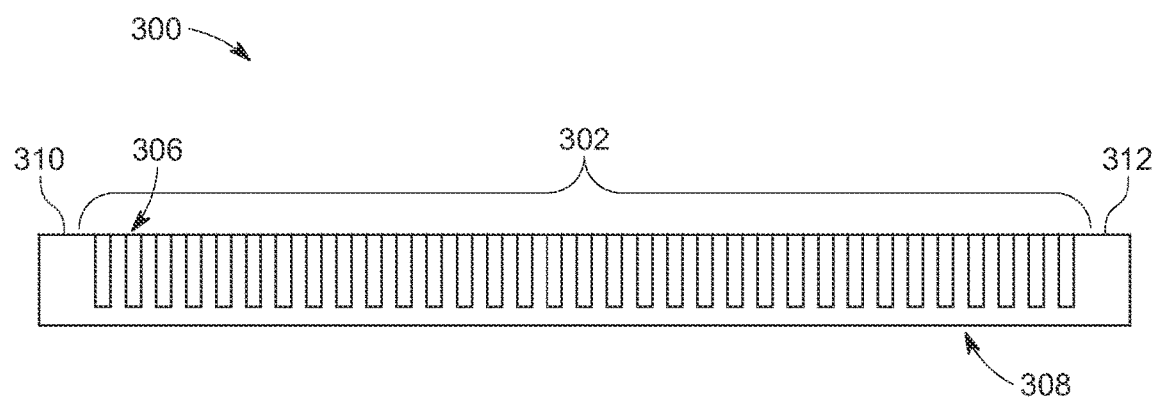
FIG. 3 is a cross-sectional view of an example base that mates with the heat sink of FIG. 2.

FIG. 3 is a cross-sectional view of a base 300 that mates with the heat sink 200 shown in FIG. 2. The base 300 includes a top side 306, a bottom side 308, a left side 310, and a right side 312. In the illustrated implementation, the base 300 has a generally rectangular cross-section and resembles an octagonal prism. In other implementation, the shape may resemble a hollow rectangular, pentagonal, hexagonal, heptagonal, nonagonal, decagonal prism or a prism with more sides. A plurality of grooves 302 extend from the top side 306 toward the bottom side 308. The grooves 302 do not extend the entire height of the base 300. Furthermore, the plurality of grooves 302 may not extend the entire length of the top side 306. Thus, the left side 310 and the right side 312 bound the ends of the grooves 302. In the illustrated implementation, the base 300 is made of copper. In other implementations, the base 300 may be made of another thermally conductive metal, such as aluminum or graphite. In some implementations, the base 300 may also be a cold plate. Each of the plurality of grooves 302 may be generally rectangular in shape. In other implementations, the plurality of grooves 302 may exhibit a shape different from a rectangle, such as triangle. Generally, the shape of the plurality of grooves 302 matches the shape of the plurality of fins 202.

Figure 4:
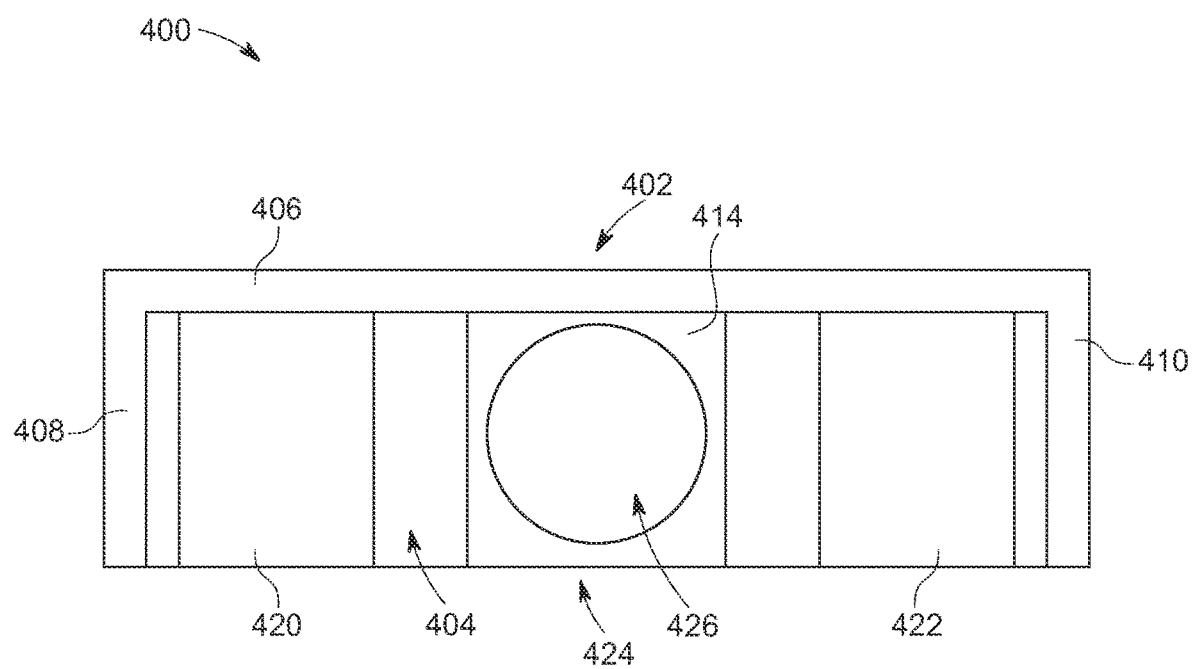
FIG. 4 is a cross-sectional view of an example top cover that mates with the base of FIG. 3.

FIG. 4 is a cross-sectional view of a cover 400 that mates with the base 300 shown in FIG. 3. As illustrated, the cover 400 has a generally rectangular cross-section with a generally circular cutout, such as a first circular aperture 426 in the center. The three-dimensional shape of the cover 400 resembles a hollow octagonal prism. In other implementations, the shape of the cover 400 may resemble a hollow rectangular, pentagonal, hexagonal, heptagonal, nonagonal, decagonal prism or a prism with more than ten sides. The cover 400 includes an exterior portion 402 and an interior portion 404. The cover 400 also includes a top wall 406, a first side wall 408, a second side wall 410, a third side wall 412 (shown in FIG. 5), a fourth side wall 414, a fifth side wall 416 (shown in FIG. 5), a sixth side wall 418 (shown in FIG. 5), a seventh side wall 420, an eighth side wall 422, and a bottom opening 424. Each of the side walls 408-422 are generally flat. In some implementations, the cover 400 may contain less than eight side walls, such as four side walls. The first side wall 408 and the second side wall 410 may be parallel to each other. The third side wall 412 (shown in FIG. 5) and the fourth side wall 414 may be parallel to each other. The fifth side wall 416 (shown in FIG. 5) and the eighth side wall 422 may be parallel to each other. The sixth side wall 418 (shown in FIG. 5) and the seventh side wall 420 may be parallel to each other. The cover 400 also includes the first circular aperture 426 and a second circular aperture 428 (shown in FIG. 5). In this implementation, the cover 400 is fabricated from copper. In other implementations, the cover 400 may be fabricated from another metal, such as aluminum or graphite.

Figure 5:
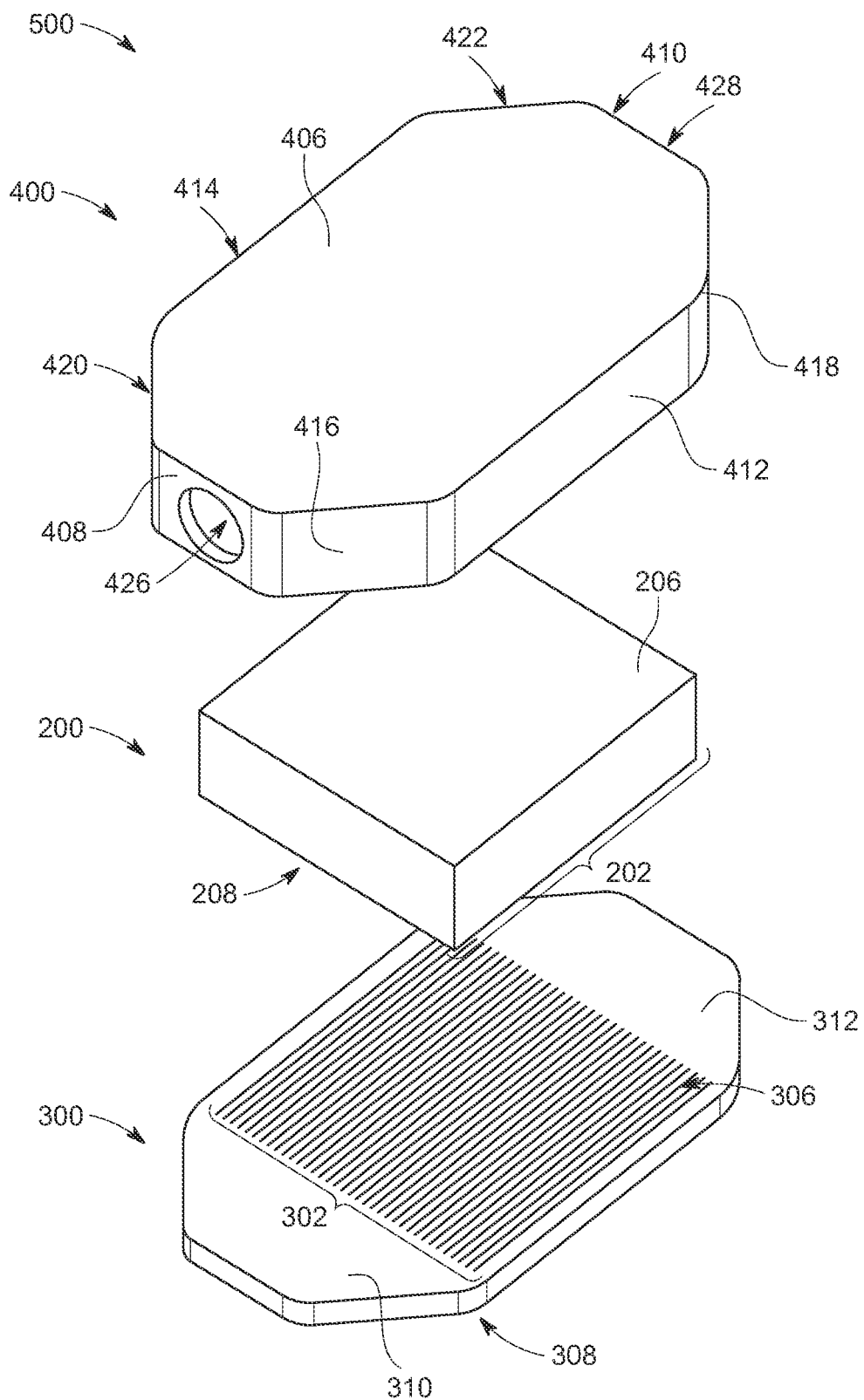
FIG. 5 is a perspective view of an example cooling device separated into components.

FIG. 5 is a perspective view of a cooling device 500 separated into components. The components of the cooling device 500 may include the heat sink 200, the base 300, and the cover 400. The cooling device 500 may also include two tubes such as the inlet tube 112 and the outlet tube 114 in FIG. 1 coupled to the first aperture 426 and the second aperture 428. When the components of the cooling device 500 are assembled together, the bottom section 208 of the plurality of fins 202 of the heat sink 200 is inserted into the plurality of grooves 302 on the top side 306 of the base 300. Thus, at least a portion of the plurality of fins 202 of the heat sink 200 fits within and mates with the plurality of grooves 302 of the base 300. Therefore, a width of the plurality of fins 202 of the heat sink 200 is less than a width of the plurality of grooves 302 of the base 300 because each fin 202 fits within each groove 302. Generally, at least a majority of the plurality of fins 202 mate with the plurality of grooves 302. In some implementations, less than a majority of the plurality of fins 202 mate with the plurality of grooves 302 when there are less fins 202 than grooves 302.

After the heat sink 200 is mated with the base 300, the cover 400 is inserted over the base 300. When the cover 400 is coupled to the base 300, the cover 400 encapsulates the heat sink 200. Thus, a height of the plurality of fins 202 of the heat sink 200 is less than a height of the cover 400 because the cover 400 fits over the heat sink 200 when the plurality of fins 202 are mated with the plurality of grooves 302 of the base 300. The cover 400 may be coupled to the base 300 by soldering the bordering edges of the cover 400 with the base 300 together such that no liquid may leak out from the cover 400. In other implementations, the cover 400 may be welded or permanently adhered to the base 300. Thus, the cover 400 and the base 300 may have the same general shape. In other implementations, the base 300 may be larger than the cover 400, thus ensuring sufficient surface area to secure the cover 400 to the base 300.

Figure 6:
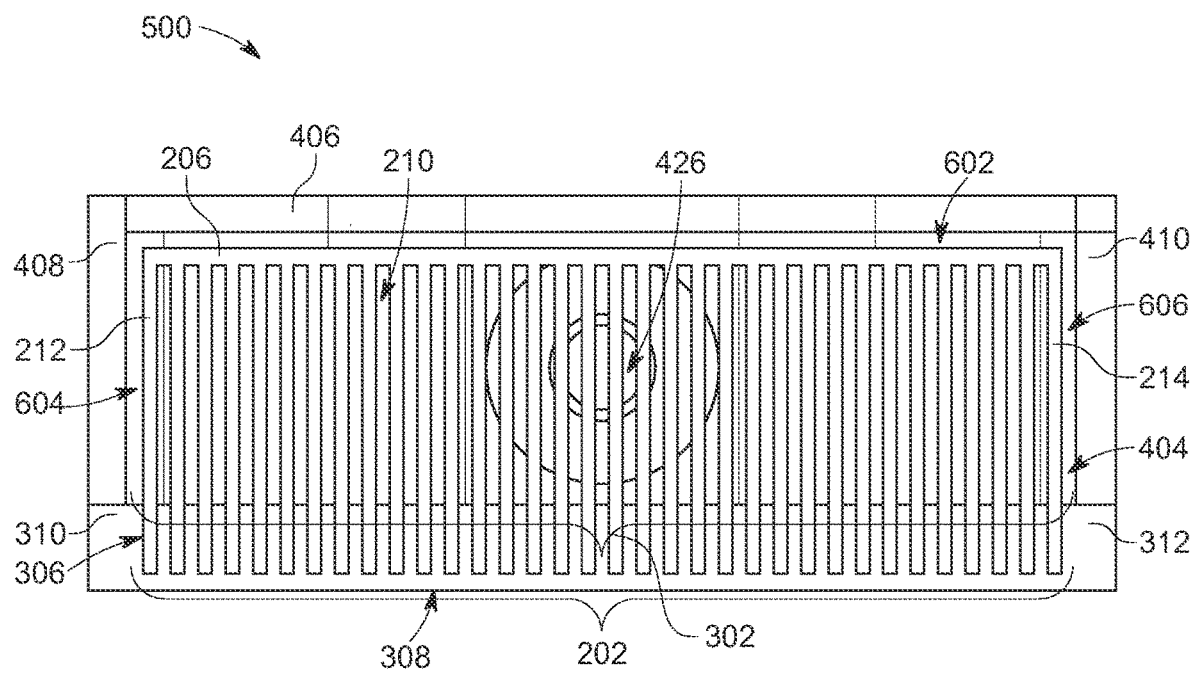
FIG. 6 is a cross-sectional view of the cooling device of FIG. 5.

FIG. 6 is a cross-sectional view of the cooling device 500. As shown and as previously described, the plurality of fins 202 on the heat sink 200 mate with the plurality of grooves 302 on the base 300, and the cover 400 is coupled to the base 300. Thus, a length of the heat sink 200 is less than a length of the base 300. The interior portion 404 of the cover 400 covers the entirety of the heat sink 200. When the cover 400 and the base 300 are coupled, a seal is formed on an interior joint between the cover 400 and the base 300 so that no liquid can escape the interior of the cooling device 500. The seal may be by welding, soldering, or an adhesive able to withstand higher temperatures that fuses, connects, fastens, or otherwise joins the pieces together. The first aperture 426 and the second aperture (shown in FIG. 5) are configured to be coupled to tube connector mechanisms to allow liquid to flow into and out of the cooling device 500.

The cross-sectional view of the cooling device 500 also shows a first space 602, a second space 604, and a third space 606. The first space 602 is defined between the top section 206 of the heat sink 300 and the interior portion 404 of the top wall 406 of the cover 400. The second space 604 is defined between the left end 212 of the heat sink 200 and the first side wall 408 of the interior portion 404 of the cover 400. The third space 606 is defined between the right end 214 of the heat sink 200 and the second side wall 410 of the interior portion 404 of the cover 400. There may also be additional spaces in between other walls of the interior portion 404 of the cover 400 and ends of the heat sink 200 not shown in FIG. 6. Thus, a height of the heat sink 200 is less than a height of the interior portion 404 of the cover 400. Similarly, a length of the heat sink 200 is less than a length of the cover 400.

Each space, including the first space 602, the second space 604, and the third space 606 provide additional flow path opportunities for the liquid coolant to flow from the first aperture 426 to the second aperture 428 (shown in FIG. 5). Additionally, the gaps 210 between the plurality of fins 202 may also provide flow path opportunities for the liquid coolant to flow. The purpose of the liquid coolant is to reduce the temperature of the components surrounding the cooling device 500 by absorbing heat from the base 300 and the fins 202 of the heat sink 200 from the electronic components. The liquid coolant may cool a component to a lower temperature by transferring heat to the liquid coolant. Examples of liquid coolant or cooling liquids may include any mixture of water, deionized water, inhibited glycol, or dielectric fluids; including ethylene glycol, propylene glycol, HFE-7100, HFE-7300, R-134a.

Figure 7:
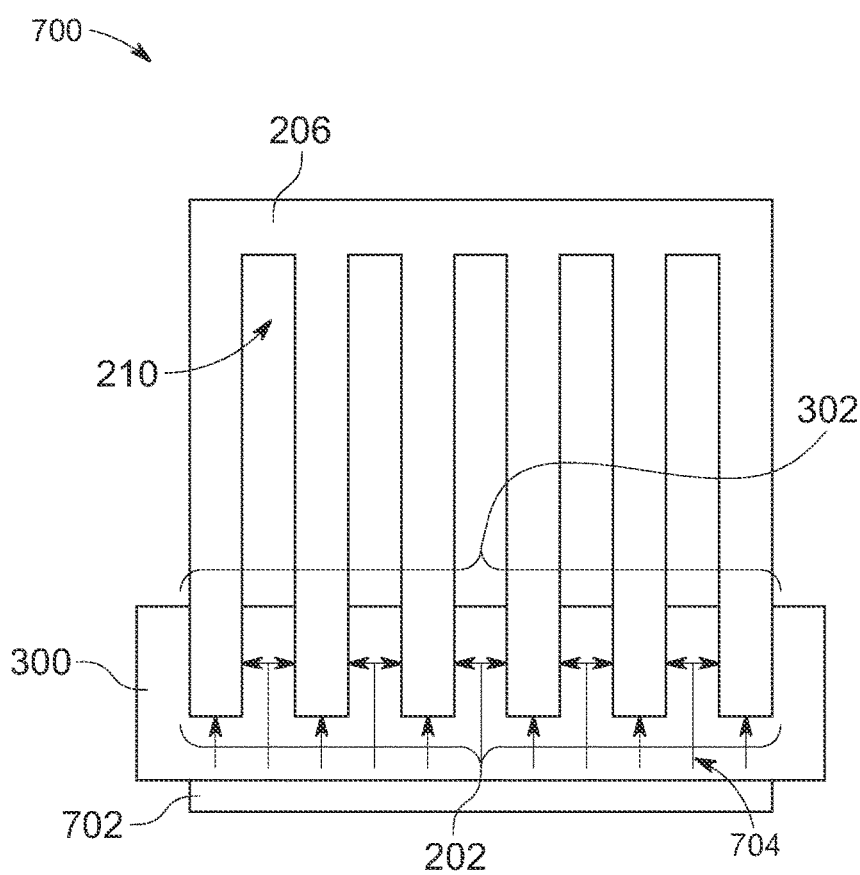
FIG. 7 is a cross-sectional view of an example heat path between the heat sink and the base.

FIG. 7 is a cross-sectional view of potential heat paths 704, displayed by arrows, between the heat sink 200 and the base 300. For example purposes, FIG. 7 shows a high-density power processing chip 702 as a heat source. In other implementations, other components of a computing system such as dual in-line memory modules (DIMMs), processor chips and the like may be used as a heat source. With the plurality of fins 202 inserted into the plurality of grooves 302, more surface area is provided, from the sides of the fins 202 and the sides of the grooves 302, that may be used to decrease the temperature of the heat source 702 than if the heat sink 200 were in an inverted position. In addition, each of the gaps 210 provide space for the liquid coolant to pass through. Thus, there are more possible heat absorbing surfaces in proximity to the heat source 702 used to cool to the heat source 702. The arrows 704 show example pathways where the heat may transfer to, and thus, be cooled when the liquid coolant is used. As result, heat may be reduced by the base 300 absorbing the heat generated by heat source 702. The absorbed heat from the base 300 is transferred to the liquid coolant, and the heat sink 200 aids in absorbing additional heat, thus maintaining a lower temperature.

Figure 8:
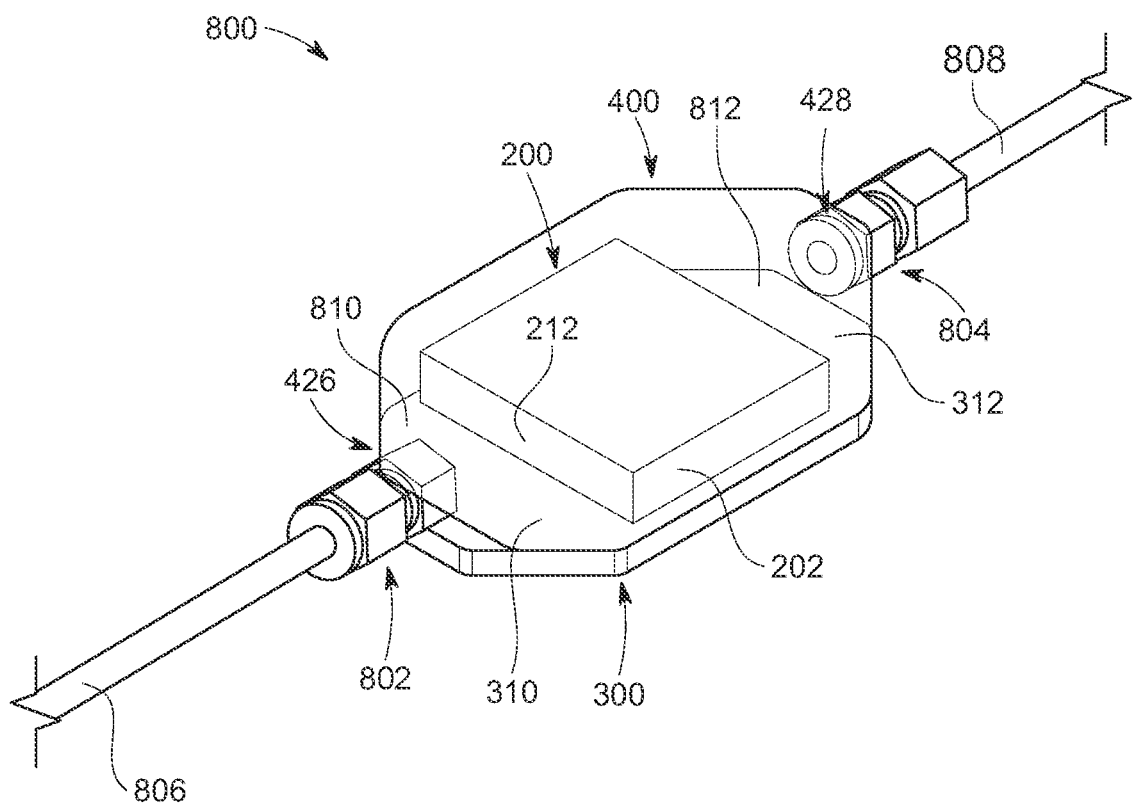
FIG. 8 is a perspective view of an example cooling assembly with a transparent top cover.

FIG. 8 is a perspective see-through view of a cooling assembly 800 with the cover 400 in an outline to show the base 300 and the heat sink 200. The cooling assembly 800 includes the heat sink 200, the base 300, the cover 400, an inlet tube 806, and an outlet tube 808. As shown, a first set of tube fittings 802 and a second set of tube fittings 804 are used on the first aperture 426 and the second aperture 428, respectively, of the cover 400. The function of the first aperture 426 and the second aperture 428 is to secure tubes carrying liquid coolant to the cooling assembly 800. The first set of tube fittings 802 and the second set of tube fittings 804 may be used to connect one end of the inlet tube 806 and the outlet tube 808, respectively, to the cover 400. The first set of tube fittings 802 and the second set of tube fittings 804 may be replaced with tube couplings. The first set of tube fittings 802 and the second set of tube fittings 804 provide a liquid-tight seal that minimizes the chances of leakage from the first circular aperture 426 and the second circular aperture 428.

The liquid coolant enters the cooling assembly 800 via the inlet tube 806. Immediately following entry into the inlet tube 806 from the first circular aperture 426, the liquid coolant flows into a first cavity 810 formed by the opening between the cover 400, the left side 310 of the base 300, and the left end 212 of the heat sink 200. The liquid coolant then flows through the heat sink 200 through the plurality of fins 202 and/or any of the first space 602, the second space 604, and the third space 606 described and shown in previously in FIG. 6. The liquid coolant then flows into a second cavity 812 formed by the opening between the cover 400, the right side 312 of the base 300, and the right end 214 of the heat sink 200. Then, the liquid coolant may exit the cooling assembly 800 by continuing its flow into the second circular aperture 428 of the cover 400 and into the outlet tube 808. Though the flow is generally linear through the cooling assembly 800, some liquid coolant may pool in certain areas.

The liquid coolant reduces the temperature of the cooling assembly 800. As a result, the components surrounding the cooling assembly 800 in the server system 100 decrease in temperature because the heat absorbed by the cooling assembly 800 may then be transferred to the liquid coolant. Thus, the temperature of the liquid coolant increases as the liquid coolant travels through heat sink 200 from the first cavity 810 to the second cavity 812 of the cooling assembly 800. Similarly, the temperature of the liquid coolant increases as it flows from the first circular aperture 426 to the second circular aperture 428 of the cover 400. As the warmer liquid coolant flows through the second cavity 812 of the cooling assembly 800, it exits the second circular aperture 428 of the cover 400, after having absorbed the heat from the different components of the server system 100 (shown in FIG. 1).

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cooling device for a computing system, the cooling device comprising:
    a heat sink having a plurality of fins extending from a common section of the heat sink;
    a cold plate base having a first surface and a second surface, the first surface including a plurality of grooves defined by respective adjacent groove walls, the second surface being configured to abut an electronic component that generates heat, the plurality of grooves receiving and being in contact with respective ones of the plurality of fins in a staggered arrangement, the staggered arrangement resulting in surrounding an end portion of each fin of the plurality of fins with respective ones of the adjacent groove walls, the staggered arrangement forming a heat conduction path via which the generated heat is conducted across the cold plate base from the second surface side to the plurality of groves on the first surface; and
    a cold plate cover configured to be coupled to the cold plate base and encapsulate the heat sink, the cold plate cover forming an additional heat conduction path with the common section of the heat sink.

2. The cooling device of claim 1, wherein the cold plate cover further includes two apertures, each aperture of the two apertures configured to be connected to a tube.

3. The cooling device of claim 1, wherein a width of the plurality of fins of the heat sink is less than a width of the plurality of grooves of the cold plate base.

4. The cooling device of claim 1, wherein a height of the heat sink is less than a height of an interior portion of the cold plate cover.

5. The cooling device of claim 1, wherein a length of the heat sink is less than a length of the cold plate base.

6. The cooling device of claim 1, wherein the plurality of fins is rectangular-shaped.

7. The cooling device of claim 1, wherein the heat sink is formed from graphite, and wherein the cold plate cover and the cold plate base are formed from a metal.

8. A cooling assembly for a computing system, the cooling assembly comprising:
    an inlet tube configured to transport liquid into the cooling assembly;
    an outlet tube configured to transport the liquid out of the cooling assembly; and a device comprising:
- a heat sink having a plurality of fins extending from a common first section of the heat sink;
- a cold plate base having a first surface and a second surface, the first surface including a plurality of grooves defined by respective adjacent groove walls, the second surface being configured to abut an electronic component that generates heat, the plurality of grooves receiving and being in contact with respective ones of the plurality of fins in a staggered arrangement, the staggered arrangement resulting in surrounding an end portion of each fin of the plurality of fins with respective ones of the adjacent groove walls, the staggered arrangement forming a heat conduction path via which the generated heat is conducted across the cold plate base from the second surface side to the plurality of groves on the first surface; and
- a cold plate cover configured to be coupled to the cold plate base to encapsulate the heat sink, the cold plate cover forming an additional heat conduction path with the common section of the heat sink, wherein the cold plate cover includes a connector to the inlet tube to accept an inflow of the liquid and a connector to the outlet tube to carry away the liquid.

9. The cooling assembly of claim 8, wherein the cold plate cover further includes two apertures, each aperture configured to be connected to either the outlet tube or the inlet tube.

10. The cooling assembly of claim 8, wherein a width of the plurality of fins of the heat sink is less than a width of the plurality of grooves of the cold plate base.

11. The cooling assembly of claim 8, wherein a height of the heat sink is less than a height of an interior portion of the cold plate cover.

12. The cooling assembly of claim 8, wherein a length of the heat sink is less than a length of the cold plate base.

13. The cooling assembly of claim 8, wherein the plurality of fins is rectangular-shaped.

14. The cooling assembly of claim 8, wherein the heat sink is formed from graphite, and wherein the cold plate cover and the cold plate base are formed from a metal.

15. A system comprising:
- an inlet tube couplable to a liquid coolant circulation system for transporting liquid coolant from the liquid coolant circulation system;
- an outlet tube couplable to the liquid coolant circulation system for transporting the liquid coolant to the liquid coolant circulation system;
- an electronic component generating heat; and
- a device thermally connected to the electronic component, the device comprising:
  - a heat sink having a plurality of fins extending from a common first section of the heat sink;
  - a cold plate base having a first surface and a second surface, the first surface including a plurality of grooves defined by respective adjacent groove walls, the second surface being configured to abut the electronic component, the plurality of grooves receiving and being in contact with respective ones of the plurality of fins in a staggered arrangement, the staggered arrangement resulting in surrounding an end portion of each fin of the plurality of fins with respective ones of the adjacent groove walls, the staggered arrangement forming a heat conduction path via which the generated heat is conducted across the cold plate base from the second surface side to the plurality of groves on the first surface; and
  - a cold plate cover configured to be coupled to the cold plate base and encapsulate the heat sink, the cold plate cover forming an additional heat conduction path with the common section of the heat sink, wherein the cold plate cover is configured to be coupled to the inlet tube and the outlet tube.

16. The system of claim 15, wherein the cold plate cover further includes two apertures, each aperture configured to be connected to either the outlet tube or the inlet tube.

17. The system of claim 15, wherein a width of the plurality of fins of the heat sink is less than a width of the plurality of grooves of the cold plate base.

18. The system of claim 15, wherein a height of the heat sink is less than a height of an interior portion of the cold plate cover.

19. The system of claim 15, wherein a length of the heat sink is less than a length of the cold plate base.

20. The system of claim 15, wherein the plurality of fins is rectangular-shaped.

* * * * *